(12) United States Patent
Bach et al.

(10) Patent No.: US 9,769,961 B2
(45) Date of Patent: Sep. 19, 2017

(54) SWITCH CABINET ARRANGEMENT

(71) Applicant: Rittal GmbH & Co. KG, Herborn (DE)

(72) Inventors: Michael Bach, Siegbach (DE); Gunther Bloecher, Eschenburg (DE); Volker Schmittgall, Breitscheid (DE)

(73) Assignee: RITTAL GMBH & CO. KG (DE)

( * ) Notice: Subject to any disclaimer, the term of this patent is extended or adjusted under 35 U.S.C. 154(b) by 0 days.

(21) Appl. No.: 15/066,641

(22) Filed: Mar. 10, 2016

(65) Prior Publication Data

US 2016/0278243 A1    Sep. 22, 2016

(30) Foreign Application Priority Data

Mar. 16, 2015 (DE) .................... 20 2015 101 339 U

(51) Int. Cl.
*H05K 7/20* (2006.01)
*H05K 7/14* (2006.01)

(52) U.S. Cl.
CPC ....... *H05K 7/20754* (2013.01); *H05K 7/1489* (2013.01); *H05K 7/20145* (2013.01); *H05K 7/20736* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 7,867,070 B2 * 1/2011 Day .................... H05K 7/20745
454/184
8,040,673 B2 * 10/2011 Krietzman ......... H05K 7/20736
165/104.19

(Continued)

FOREIGN PATENT DOCUMENTS

DE 202013100336 U1 3/2013
DE 202013100338 U1 8/2013
WO WO-2009-042735 A1 4/2009

*Primary Examiner* — Anthony Haughton
*Assistant Examiner* — Razmeen Gafur
(74) *Attorney, Agent, or Firm* — Harness, Dickey & Pierce, P.L.C.

(57) ABSTRACT

A switch cabinet arrangement which includes a switch cabinet (1) with an installation frame (2) accommodated therein, which delimits an accommodation space (3) for switch cabinet fixtures and which comprises a cooling air duct (5, 6, 7), wherein the installation frame (2) comprises two parallel separated vertical profiles (4) which establish a first attachment plane (a) for the switch cabinet fixtures and wherein the cooling air duct (5, 6, 7) comprises a partition (5) which extends between the vertical profiles (4) and a respective associated switch cabinet side wall (12), characterized in that the partition (5) comprises at least one perforation (6) to which at least one air supply channel (7) is fluidically connected, which leads cooling air introduced via the perforation (6) into the air supply channel (7) in the direction of the accommodation space (3).

12 Claims, 5 Drawing Sheets

(56) References Cited

U.S. PATENT DOCUMENTS

| | | | |
|---|---|---|---|
| 8,107,238 B2* | 1/2012 | Krietzman | H05K 7/20745 165/104.19 |
| 2003/0235035 A1* | 12/2003 | Wintersteen | H05K 7/20736 361/679.49 |
| 2004/0114326 A1* | 6/2004 | Dodgen | H05K 7/206 361/694 |
| 2004/0217072 A1* | 11/2004 | Bash | H05K 7/20736 211/26 |
| 2005/0225936 A1* | 10/2005 | Day | H05K 7/20745 361/679.47 |
| 2008/0266789 A1* | 10/2008 | Hruby | H05K 7/20572 361/692 |
| 2008/0316702 A1* | 12/2008 | Donowho | H05K 7/20572 361/692 |
| 2009/0061755 A1* | 3/2009 | Calder | H05K 7/20736 454/184 |
| 2010/0033930 A1* | 2/2010 | Wada | H05K 7/20581 361/695 |
| 2010/0172092 A1* | 7/2010 | Davis | H05K 7/20736 361/692 |
| 2011/0026225 A1* | 2/2011 | Ostwald | H05K 7/20645 361/699 |
| 2011/0063778 A1* | 3/2011 | Brouillard | H05K 7/20645 361/678 |
| 2011/0105010 A1* | 5/2011 | Day | H05K 7/20745 454/184 |
| 2012/0008275 A1* | 1/2012 | Doll | G06F 1/20 361/679.47 |
| 2013/0039006 A1* | 2/2013 | Li | H05K 7/20736 361/679.48 |
| 2013/0063894 A1* | 3/2013 | Wang | H05K 7/1492 361/692 |
| 2013/0070416 A1* | 3/2013 | Adducci | H05K 7/20572 361/694 |
| 2013/0188309 A1* | 7/2013 | Ross | H05K 7/20727 361/679.48 |
| 2013/0229769 A1* | 9/2013 | Yang | G06F 1/20 361/679.53 |
| 2013/0242503 A1* | 9/2013 | Yi | H05K 7/20709 361/679.48 |
| 2013/0342991 A1* | 12/2013 | Sun | G06F 1/20 361/679.46 |
| 2014/0002988 A1* | 1/2014 | Roesner | G06F 1/20 361/679.49 |
| 2014/0085810 A1* | 3/2014 | Xu | H05K 7/1492 361/679.48 |
| 2014/0085811 A1* | 3/2014 | Ning | G06F 1/189 361/679.48 |
| 2014/0177164 A1* | 6/2014 | Stewart | H05K 7/20145 361/679.46 |
| 2014/0285966 A1* | 9/2014 | Tang | H05K 7/20709 361/679.54 |
| 2015/0208554 A1* | 7/2015 | Leigh | G06F 1/20 165/80.3 |
| 2016/0088775 A1* | 3/2016 | Bailey | H05K 7/20727 361/679.47 |

* cited by examiner

SWITCH CABINET ARRANGEMENT

This application claims the benefit and priority of DE 20 2015 101 339.6, filed Mar. 16, 2015. The entire disclosure of the above application is incorporated herein by reference.

FIELD

The invention relates to a switch cabinet arrangement which comprises a switch cabinet with an installation frame accommodated therein, which delimits an accommodation space for switch cabinet fixtures and which comprises a cooling air duct, wherein the installation frame comprises two parallel separated vertical profiles which establish a first attachment plane for the switch cabinet fixtures and wherein the cooling air duct comprises a partition which extends between the vertical profiles and a respective associated switch cabinet side wall. Such a switch cabinet arrangement is known from DE 10 2007 034 437 A1.

BACKGROUND

Switch cabinet arrangements according to the preamble are frequently designed in order to provide, in an area between the installation frame and the back wall of the switch cabinet, cold air from a cooling apparatus, which is suctioned backwards by the switch cabinet fixtures, for example, IT apparatuses such as servers and the like, and blown out as heated air on the front side. However, IT apparatuses are also known that are designed for lateral suctioning or injecting of cooling air. In order to ensure a sufficient cooling air supply for such switch cabinet fixtures as well, a channel system for the targeted cooling air supply is known from DE 20 2013 100 338 U1. In the latter, instead of the partition or integrated in said partition, a cooling air channel with perforations to be opened if needed is provided, to which an air supply channel can be connected in order to supply the cooling air to a certain switch cabinet component in a targeted manner. However, the channel system has the disadvantage that its design is relatively expensive.

SUMMARY

Therefore, the problem of the invention is to refine a switch cabinet arrangement according to the preamble in such a way that it allows the targeted cooling air supply for switch cabinet fixtures with lateral cooling air supply using the simplest possible means.

This problem is solved by a switch cabinet arrangement having the features of the various embodiments of the invention.

Accordingly, the partition comprises at least one perforation to which at least one air supply channel is fluidically connected, which leads cooling air introduced via the perforation into the air supply channel in the direction of the accommodation space. Instead of providing a channel system, the invention thus proposes to use, in a switch cabinet arrangement according to the invention, the partition that is present in any case between the installation frame and the switch cabinet housing for the cooling air supply, by providing it with perforations to which the air supply channels can be connected if needed.

It is possible to provide that the perforations have an opening cross section that is greater than the inlet cross section of the air supply channel. In the process, it is possible moreover to provide that, in areas to which no air supply channel is connected, the perforations can be closed with a closure, for example, a blind plug. The partition can have a plurality of perforations in vertical direction, which are separated from one another by webs, in order to confer sufficient torsional rigidity to the partition.

The air supply channel can be designed so that the cooling air flowing in through its air inlet side is deflected by substantially 90°. The air supply channel can moreover be designed as a diffuser, that is to say it can have a larger cooling air outlet as cooling air inlet. Moreover, it is possible to provide that the cooling air is supplied to the accommodation space via a cooling air outlet of the air supply channel to the side and parallel relative to the attachment plane. The air supply channel can provide a deflection by substantially 90° of the cooling air flow flowing out via the perforations.

It is provided particularly advantageously that at least one supply or data line is led through the air supply channel. In the process, the supply or data line can be led from a switch cabinet fixture accommodated in the accommodation space through the air supply channel and through the perforation in the partition. Moreover, the air supply channel can have a passage for the introduction of a supply or data line into the interior of the air supply channel. The passage here can be formed on a front side of the air supply channel facing away from the partition. The air supply channel can thus also have a cable management function, for example, in order to implement an ordered cable routing in the case of a plurality of switch cabinet fixtures arranged vertically one above the other on the installation frame.

As already known from DE 20 2013 100 338 U1, the air supply channel can be designed so it can be telescoped in its longitudinal direction and in the process it can have two channel sections that are movable relative to one another. Now it can be provided, in addition, that the air supply channel is fluidically connected to the perforation via the first channel section, wherein the second channel section has the front side with the passage for the cable feedthrough.

In an embodiment, the passage is formed in a wall section of the front side of the air supply channel which is arranged at an angle where $90°<\alpha<180°$, preferably at an angle where $110°<\alpha<150°$, and particularly preferably at an angle of 135° relative to the longitudinal direction (telescoping direction) of the air supply channel.

The switch cabinet arrangement can have a switch cabinet with a cuboid rack, which is formed from four vertical and eight horizontal struts. Such a rack is known, for example, from DE 196 47 814 C2 or from DE 296 23 065 U1. Moreover, it is possible to provide that the two switch cabinet side walls are flat parts connected to the rack, as known from DE 198 01 720 C1. Now, it is possible to provide here that the partition extends between the vertical profiles of the installation frame and the respective associated flat part and is in contact with the flat part via a sealing element. The partition here can have a sheet metal part, or consist of such a sheet metal part, which is connected to one of the vertical profiles, preferably by screw connection, wherein, at a longitudinal edge of the sheet metal part facing the switch cabinet side wall, the sealing element is put on. The sealing element can here be a brush strip, for example.

It is particularly preferable for the installation frame to be an installation frame for the 19" switch cabinet interior construction. For the installation of the air supply channel, it is possible to provide that the installation frame comprises, adjoining the partition, or at a fixed distance from said partition, a vertical profile side with a system perforation extending in vertical direction consisting of regularly spaced attachment accommodations. In principle, the air supply channel can also be connected directly to the partition. For the attachment, it is preferable to use attachment means that do not require the use of a tool, such as clips or the like, in order to be able to vary the vertical arrangement of the air supply channel without large expense in case of need.

BRIEF DESCRIPTION OF THE DRAWINGS

Further details of the invention are explained in reference to the following figures.

DETAILED DESCRIPTION

Figure 1:
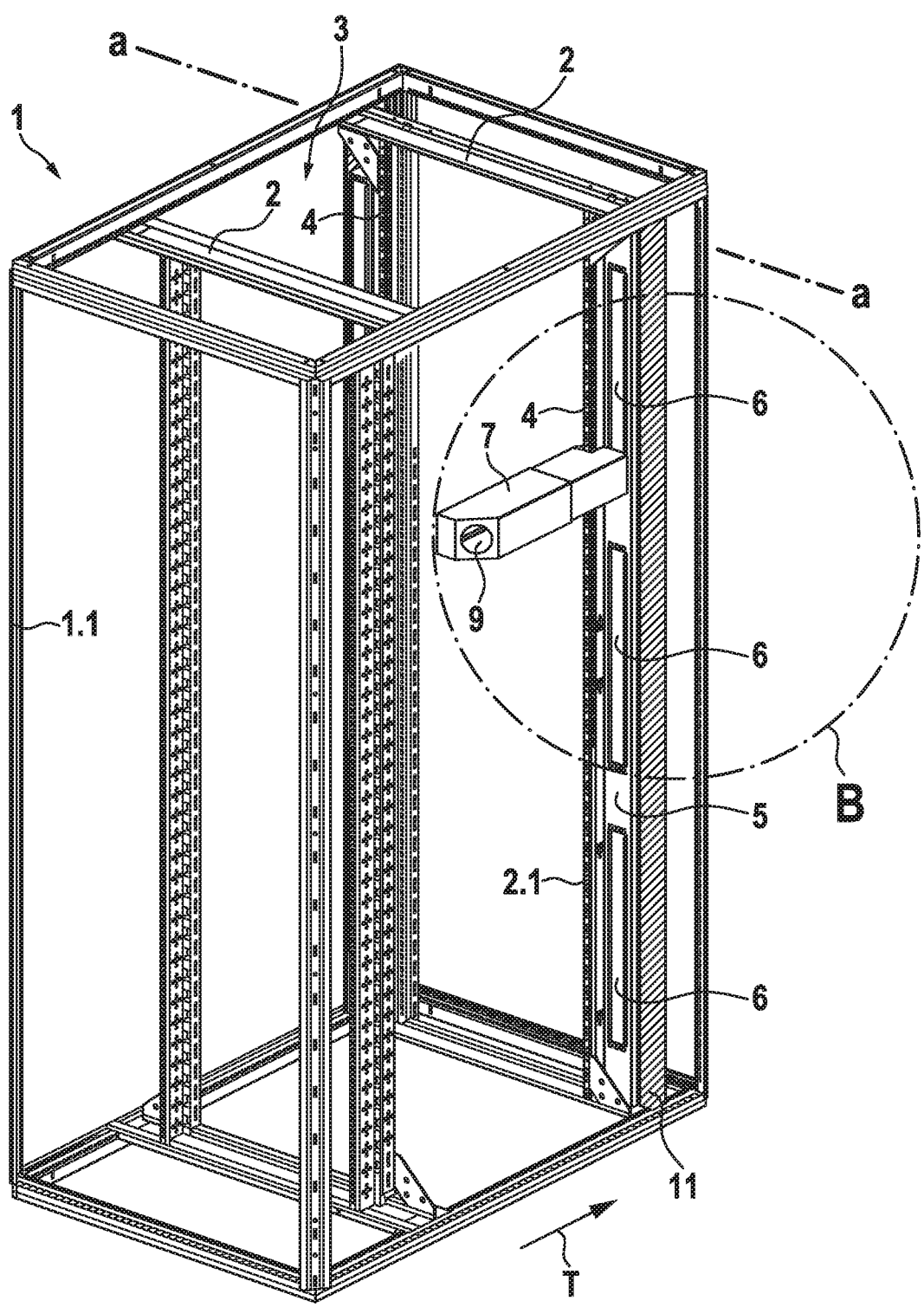
FIG. 1 shows a perspective front view of an embodiment of the switch cabinet arrangement.

FIG. 1 shows a switch cabinet arrangement which has a switch cabinet 1 with a rack 1.1. For greater clarity, the flat parts covering the rack 1.1 are not represented. In the representation, the foremost side of the rack 1.1 forms the door side, while the facing side forms the back side of the switch cabinet 1. Accordingly, in FIG. 1 the depth direction T is indicated.

In the switch cabinet interior formed by the rack 1.1, a first and a second installation frame 2 are accommodated, which in each case form a 19" installation plane for 19" switch cabinet fixtures such as servers and the like. The installation frames 2 in each case have two vertical profiles 4 that are parallel and at a distance from each other and that are connected at the ends to one another by horizontal rails which in turn are then connected to the horizontal profiles of the rack 1.1, in order to arrange the installation frame 2 in the interior of the switch cabinet 1 and at a certain grid spacing in the depth direction, which is predetermined by the system perforation of the horizontal profiles of the rack 1.1.

The rear installation frame 2 in the representation has a partition 5 which extends from one of the vertical profiles 4 in the direction of the side wall of the switch cabinet 1, in order to thus partition off the accommodation space 3 for the switch cabinet fixtures from an area which is formed behind the rear installation frame 2 and the back wall of the switch cabinet 1, and into which cooling air can be injected. The partition 5 can have a brush strip 11 on its longitudinal edge facing the switch cabinet side wall, brush strip which is used as sealing element.

The partition 5 has a plurality of perforations 6 that are vertically separated from one another and separated from one another by webs, in order to confer in this manner sufficient stability to the partition 5 formed, for example, as a sheet metal part. The air supply channel 7 represented is fluidically connected via its air inlet side to one of the perforations 6. On its front side facing the air inlet side the air supply channel 7 has a passage 9 for the introduction of supply or data lines.

Figure 2:
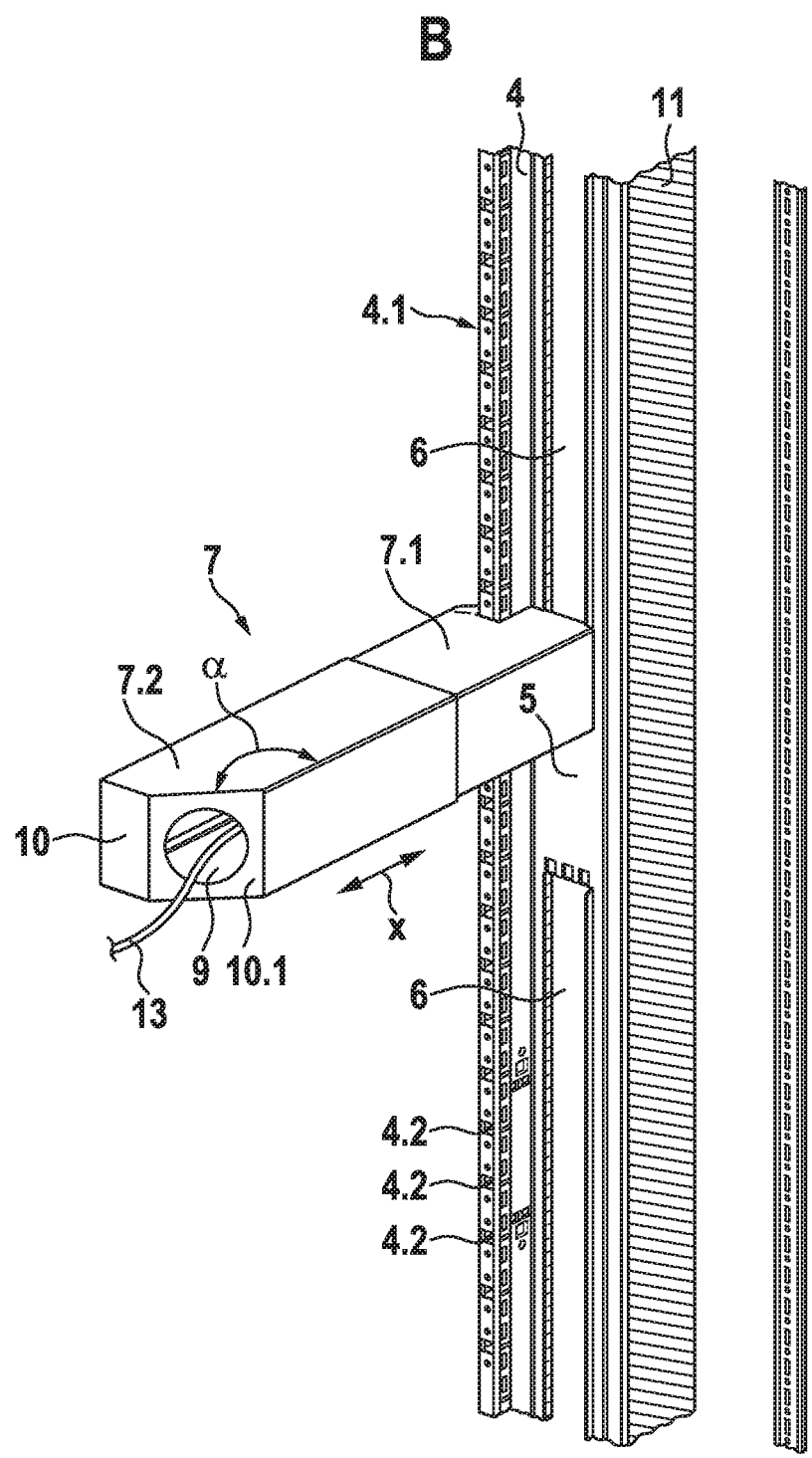
FIG. 2 shows a detail enlargement of FIG. 1.

The installation of the air supply channel 7 on the vertical profile 4 of the installation frame 2 as well as the supply of the supply or data line is shown more precisely in FIG. 2. Here, one can see that the supply or data line 13 is introduced via the passage 9 formed on the front side 10 of the air supply channel 7 into the interior of the air supply channel 7. More precisely, the front side 10 has a wall section 10.1 in which the passage 9 is formed, wherein the wall section 10.1 is oriented by an angle α of approximately 135° relative to the longitudinal direction x of the air supply channel 7, in order to simplify the cable introduction. FIG. 2 moreover shows the vertical profile 4 of the rear installation frame 2 according to FIG. 1, which has a system perforation formed along its vertical direction and consisting of circular passages and rectangular passages. The air supply channel 7 can be connected, for example, by a clip to the vertical profile 4. It is also possible to provide that cage nuts are inserted into the vertical profile 4, which are used for screwing the air supply channel 7 to the vertical profile 4.

Moreover, in FIG. 2, one can see that the air supply channel 7 does not completely cover the opening cross section of the perforation 6 of the partition 5. It is possible to provide that, if needed, in the opening cross sections of the perforation 6 that are not covered by the represented air supply channel 7, additional air supply channels 7 are arranged in order to supply cooling air to switch cabinet fixtures located higher in the vertical direction or deeper. However, it is also possible to provide that the opening cross sections of the perforation 6 that are not covered by an air supply channel 7 are closed by a blind plug or if desired by a cover that can be engaged in the perforations 6.

The partition 5 can be produced as a shaped sheet metal part or from an injection molded plastic. Along the longitudinal edge of the partition 5 facing away from the vertical profile 4, a sealing element 11 is put on, which can be a brush strip, for example, in order to seal the partition 5 with respect to a side wall (not shown) of the switch cabinet 1.

Figure 3:
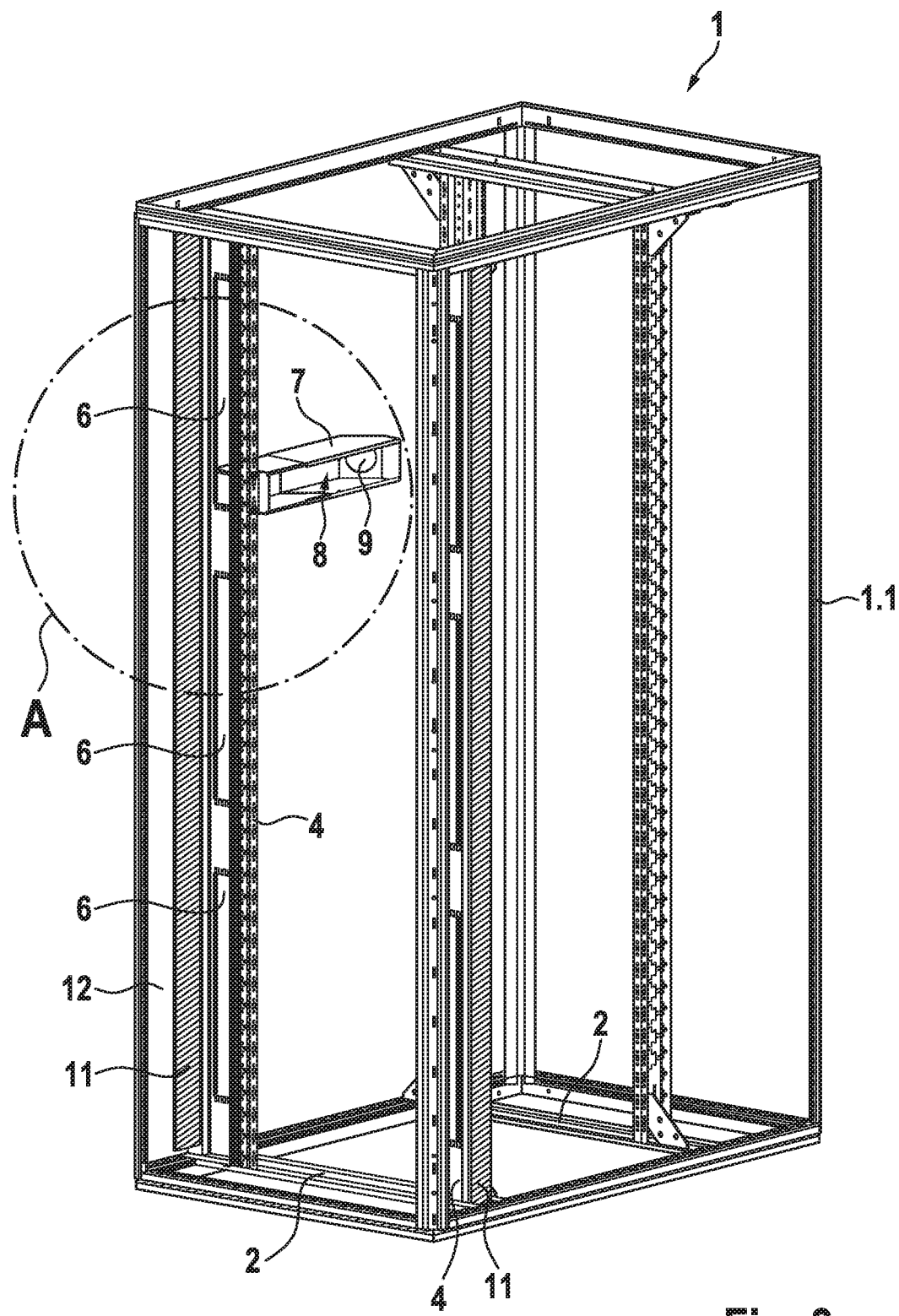
FIG. 3 shows a perspective rear view of the embodiment according to FIGS. 1 and 2.
Figure 4:
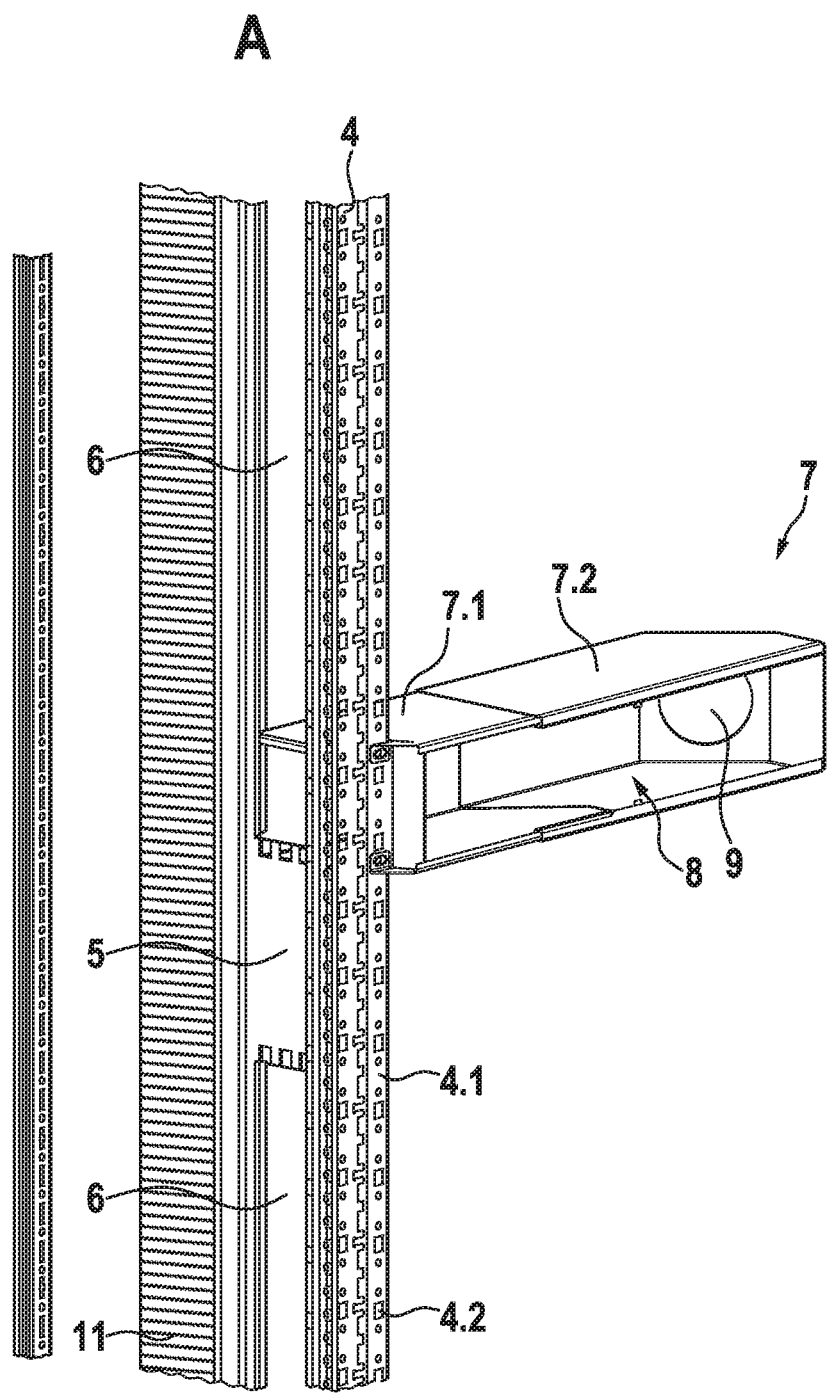
FIG. 4 shows a detail view of FIG. 3.

FIGS. 3 and 4 show the switch cabinet arrangement according to FIGS. 1 and 2 in the rear view. In FIG. 3, one can see that, via the sealing elements 11 formed on the facing vertical profiles 4, an area between the back wall and the rear installation frame 2 is partitioned off, which is used, for example, for injecting cooling air via a cooling apparatus, so that the cooling air provided by the cooling apparatus can be provided in a targeted manner via the perforations 6 and the air supply channels 7 to the switch cabinet fixtures. In the case of use, the switch cabinet fixtures are arranged between the vertical profiles 4 of the installation frame. To the extent that the entire installation height of the installation frame is not equipped with fixtures, the areas that remain free can be covered with blind covers in order to prevent an undesired cooling air pressure loss.

FIG. 4 shows that the vertical profile 4 of the installation frame 2 has, adjoining the partition 5, a vertical profile side 4.1 with a system perforation 4.2 extending in vertical direction and consisting of regularly spaced attachment accommodations for the installation of the air supply channel 7. As one can see when looking at FIGS. 3 and 4 together, the vertical profile side 4.1 is one of three side walls of a profile projection of the vertical profile 4, of which two are connected parallel to one another via a third profile side. When the air supply channel 7 is installed, the profile protrusion engages into a recess 14 on the air inlet side of the first channel section 7.1 of the air supply channel 7, as a result of which a preliminary positioning of the air supply channel 7 is achieved. Via this profile protrusion, the air supply channel 7 can now be moved only vertically, that is to say it can be moved along the perforations 6, so that the air supply channel 7, when it has been put on the profile protrusion, can be immobilized via the system perforation in the projection in a desired position.

Figure 5:
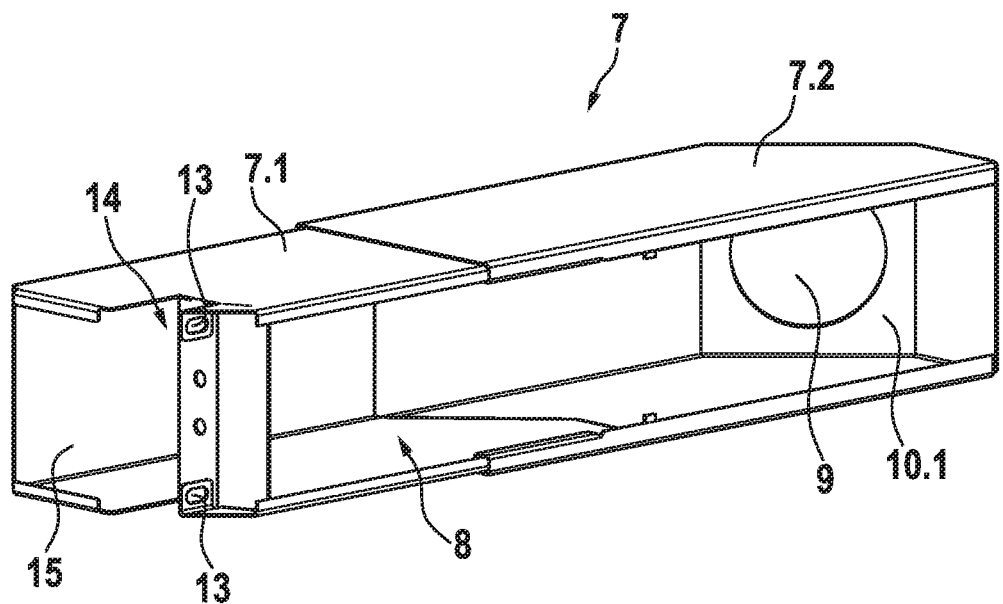
FIG. 5 shows a perspective view into the interior of an air supply channel.
Figure 6:
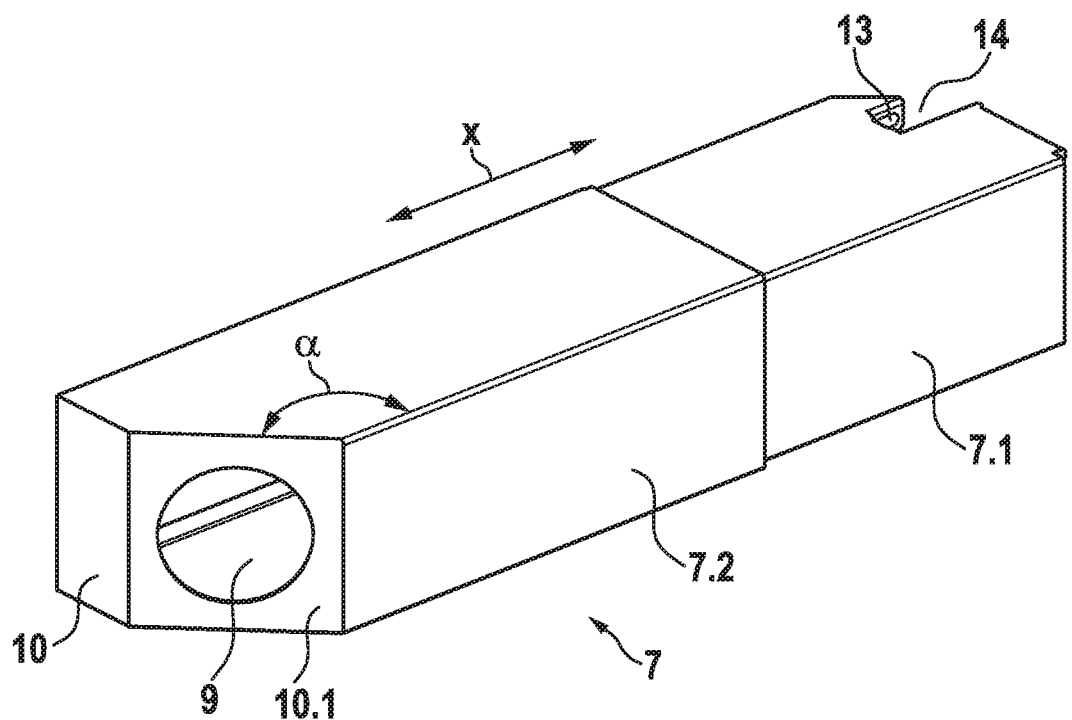
FIG. 6 shows a perspective outside view of the air supply channel according to FIG. 5.

As one can see in FIGS. 5 and 6, the air supply channel 7 is composed of a first and a second channel section 7.1, 7.2, which can be moved relative to one another in the longitudinal direction x of the air supply channel, in order to adjust in this way the air outlet cross section 8 in accordance with the existing air inlet cross section of the switch cabinet fixtures concerned. In an angled wall section 10.1 on the front side 10, the second channel section 7.2 has a passage 9 through which a supply or data line 13 (see FIG. 2) can be introduced into the interior of the air supply channel. The air supply channel 7 has an inlet cross section 15 through which cooling air is introduced into the air supply channel 7. The outlet cross section 8 of the air supply channel 7 is designed to be larger than the air inlet cross section 15, so that the air supply channel moreover has the function of a diffuser. Adjoining the air inlet cross section 15, the recess 14 is formed, through which the air supply channel 7 can be slid onto a vertical profile 4 of an installation frame 2 (see also FIGS. 2 and 4). Associated with the recess 14 there are attachment accommodations 13 which lead into the recess 14, so that, via the latter, the air supply channel 7 can be secured, for example, by screw connection, to the profile protrusion inserted into the recess 14.

The features of the invention disclosed in the above description, in the drawings as well as in the claims can be essential for the implementation of the invention both individually and also in any desired combination.

What is claimed is:

1. A switch cabinet arrangement comprising:
   a switch cabinet with an installation frame accommodated therein, which delimits an accommodation space for switch cabinet fixtures and which comprises a cooling air duct, wherein the installation frame includes two parallel separated vertical profiles which establish a first attachment plane (a) for the switch cabinet fixtures and wherein the cooling air duct includes a partition which extends between the vertical profiles and a respective associated switch cabinet side wall, wherein the partition includes at least one perforation to which at least one air supply channel is fluidically connected, which leads cooling air introduced via the perforation into the air supply channel in the direction of the accommodation space;
   the air supply channel defines a passage in fluid communication with the at least one perforation to direct cooling air through the perforation to the accommodation space, an opening of the passage is formed on a front side of the air supply channel facing away from the partition;
   the air supply channel includes a first channel section through which the air supply channel is fluidically connected to the perforation, and a second channel section which has the front side with the opening of the passage; and
   the second channel section is movable relative to the first channel section to allow the air supply channel to telescope in a longitudinal direction (x) that extends perpendicular to the partition.

2. The switch cabinet arrangement according to claim 1, in which the cooling air is supplied to the accommodation space via a cooling air outlet of the air supply channel to the side and parallel relative to the attachment plane (a).

3. The switch cabinet arrangement according to claim 1, in which at least one supply or data line is led through the air supply channel.

4. The switch cabinet arrangement according to claim 3, in which the supply or data line is led from a switch cabinet fixture accommodated in the accommodation space, through the air supply channel and through the perforation into the partition.

5. The switch cabinet arrangement according to claim 3, in which the air supply channel includes the passage for the introduction of a supply or data line into the interior of the air supply channel.

6. The switch cabinet arrangement according to claim 5, in which the passage is formed in a wall section of the front side of the air supply channel, which is arranged at an angle ($\alpha$) where $90°<\alpha<180°$, preferably at an angle ($\alpha$) where $110°<\alpha<150°$, and particularly preferably at an angle ($\alpha$) of $135°$ relative to the longitudinal direction (x).

7. The switch cabinet arrangement according to claim 1, in which the switch cabinet has a cuboid rack which is formed from four vertical and eight horizontal struts, wherein the two switch cabinet side walls are flat parts connected to the rack, and wherein the partition extends between the vertical profiles of the installation frame and the respective associated flat part and is in contact with the flat part via a sealing element.

8. The switch cabinet arrangement according to claim 7, in which the partition has a sheet metal part which is connected to one of the vertical profiles, preferably by screw connection, wherein the sealing element is put on a longitudinal edge of the sheet metal part facing the switch cabinet side wall.

9. The switch cabinet arrangement according to claim 7, in which the sealing element is a brush strip.

10. The switch cabinet arrangement according to claim 1, in which the installation frame is an installation frame for the 19" switch cabinet interior construction.

11. The switch cabinet arrangement according to claim 1, in which the vertical profile of the installation frame has, adjoining the partition, or at a fixed distance therefrom, a vertical profile side with a system perforation extending in vertical direction and consisting of regularly spaced attachment accommodations for the installation of the at least one air supply channel.

12. A switch cabinet comprising:
    a rack;
    an installation frame within the rack for mounting equipment within the rack, the installation frame includes two vertical profiles that are spaced apart and extend in parallel to establish a first attachment plane for the equipment;
    a partition arranged between the two vertical profiles;
    a perforation defined by the partition;
    an air supply channel fluidically connected to the perforation;
    a passage defined by the air supply channel through which cooling air can pass and enter the switch cabinet through the perforation, an opening of the passage is formed on a front side of the air supply channel facing away from the partition;
    wherein:
      the air supply channel includes a first channel section through which the air supply channel is fluidically connected to the perforation, and a second channel section including the front side and the opening of the passage;
      the second channel section is movable relative to the first channel section to allow the air supply channel to telescope in a longitudinal direction (x) that extends perpendicular to the partition.

* * * * *